United States Patent
Kaneko (10) Patent No.: US 6,466,440 B2
(45) Date of Patent: Oct. 15, 2002

(54) CIRCUIT BOARD COOLING APPARATUS WITH AIR GUIDE PLATES

(75) Inventor: Toru Kaneko, Iwata-gun (JP)

(73) Assignee: Minebea Co., Ltd., Nagano-ken (JP)

( * ) Notice: Subject to any disclaimer, the term of this patent is extended or adjusted under 35 U.S.C. 154(b) by 0 days.

(21) Appl. No.: 09/968,759

(22) Filed: Oct. 3, 2001

(65) Prior Publication Data

US 2002/0041485 A1 Apr. 11, 2002

(30) Foreign Application Priority Data

Oct. 5, 2000 (JP) ........................................ 2000-306194

(51) Int. Cl.[7] ................................................. H05K 7/20
(52) U.S. Cl. ........................ 361/690; 361/692; 361/694; 174/16.1; 165/80.2; 165/104.33; 454/184
(58) Field of Search .................................. 361/687–695; 174/16.1; 165/80.2, 80.3, 104.33, 122; 454/184

(56) References Cited

U.S. PATENT DOCUMENTS

| 5,183,104 A | * | 2/1993 | Novotny | ................ | 165/104.33 |
|---|---|---|---|---|---|
| 5,428,503 A | * | 6/1995 | Matsushima et al. | ........ | 361/695 |
| 5,814,789 A | * | 9/1998 | O'Leary et al. | ............. | 219/388 |
| 5,969,942 A | * | 10/1999 | Heckner et al. | ............. | 361/695 |
| 6,181,557 B1 | * | 1/2001 | Gatti | .......................... | 361/695 |
| 6,272,311 B1 | * | 8/2001 | Baughman et al. | ......... | 399/341 |
| 6,347,734 B1 | * | 2/2002 | Downes | ................. | 228/180.21 |

* cited by examiner

Primary Examiner—Boris Chervinsky
(74) Attorney, Agent, or Firm—Oliff & Berridge, PLC (57) ABSTRACT

In a circuit board cooling apparatus, inclined rectifier plates 25 are disposed on a plane rectifier plate 21 with an inclination of about 45°, and an air guide plate 26 is disposed toward a distal end of the inclined rectifier plate 25 such that a distal end 26b of the air guide plate 26 is in contact with a soldering face 2 of a circuit board 1. Cooling air from openings 15 is rectified and guided upward due to a plane rectifier plate 21 and the inclined rectifier plates 25, and the cooling air also flows through between the soldering face 2 of the circuit board 1 and the air guide plate 26 so as to be converged on a soldered portion 3 on the circuit board 1. As a result, the soldered portion 3 is pinpointedly cooled and a cooling rate is improved, thereby improving cooling capability. The cooling rate can be set to 50° C./sec or higher, and the use of Pb-free solder is promoted replacing Sn—Pb eutectic solder which has been conventionally employed, thereby enhancing environmental protection.

9 Claims, 6 Drawing Sheets

CIRCUIT BOARD COOLING APPARATUS WITH AIR GUIDE PLATES

BACKGROUND OF THE INVENTION

1. Field of the Invention

The present invention relates to a circuit board cooling apparatus disposed in a flow soldering apparatus to solder electronic parts or the like on a circuit board and used for cooling the circuit board on which the electronic parts have been soldered.

2. Description of the Related Art

Up to now, in a flow soldering apparatus to solder electronic parts or the like on a circuit board, molten solder is supplied to a joint between the electronic parts to be soldered and the circuit board, the electronic parts are soldered onto the circuit board, and thereafter a circuit board cooling apparatus disposed in the flow soldering apparatus is actuated to cool a temperature of a soldering face of the circuit board down to a room temperature.

Figure 10:
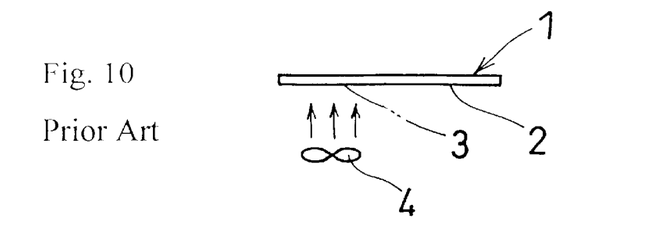
FIG. 10 is a schematic view showing an example of a conventional circuit board cooling apparatus using a cooling fan.
Figure 11A:
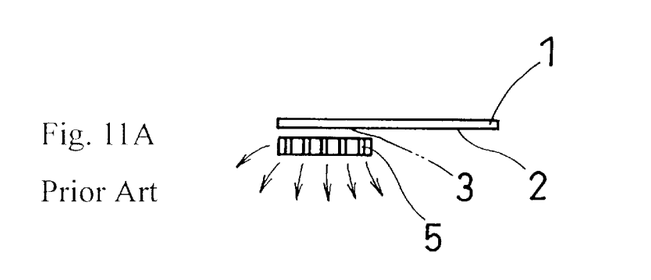
FIG. 11A is a diagram showing the cooling fin and a circuit board and FIG. 11B is a perspective view showing the cooling fin.
Figure 11B:
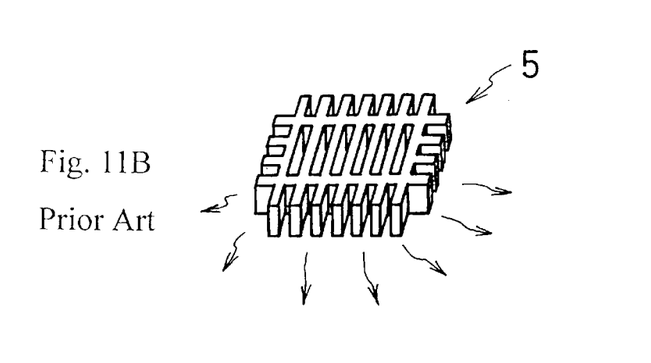
Figure 12:
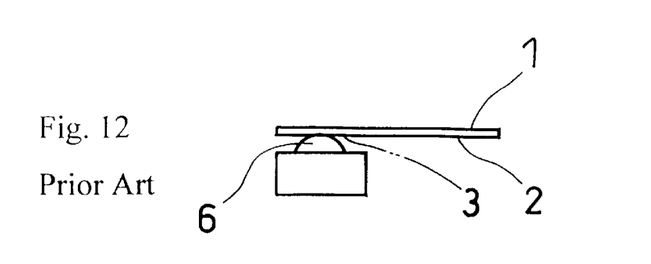
FIG. 12 is schematic view showing an example of a conventional circuit board cooling apparatus of refrigerant contact type.

As a cooling method, for example, a heat radiation system by means of a cooling fan or a cooling fin is used. The former heat radiation system by means of a cooling fan answers a purpose of rapidly releasing the electronic parts from a heat stress suffered at the time of soldering, in which as shown in FIG. 10, air is blown by a cooling fan 4 against a soldered portion 3 on a soldering face 2 of a circuit board 1 at an exit of a solder bath (not shown) to supplement the effect of natural cooling. Chilly air (15 to 20° C.) may be auxiliarily blown to speed up a cooling rate. The latter heat radiation system by means of a cooling fin also answers a purpose of rapidly releasing the electronic parts from a heat stress suffered at the time of soldering, in which as shown in FIGS. 11A and 11B, a cooling fin 5 of multiple structure as a radiation plate is disposed close to the soldered portion 3 on the circuit board 1 at an exit of a solder bath (not shown) to absorb radiation heat from the circuit board 1 which is warm immediately after soldering, thereby indirectly cooling the circuit board 1. Also, as another cooling method, there has been proposed a refrigerant contact system, in which a coolant 6 is brought in direct contact with the soldered portion 3 on the circuit board 1, as shown in FIG. 12.

The above-described conventional cooling apparatuses have the purpose of rapidly releasing the electronic parts from a heat stress suffered at the time of soldering, and, depending on cooling conditions after soldering, may invite such problems as lift-off, shrinkage cavities that make filet surface rough, faded gloss of the solder after soldering and deterioration in mechanical strength. And the prior art has not provided improvement to solve the above problems.

In general, when the soldered portion is rapidly cooled, its organization is closely packed thereby improving mechanical strength. It is supposedly desirable that the rapid cooling of the soldered portion is conducted at a cooling rate of 50° C./sec or higher immediately after soldering.

Also, from the viewpoint of the environmental protection, which is promoted recently, Pb-free solder is increasingly replacing Sn—Pb eutectic solder. which has been conventionally employed. Because the Pb-free solder is different in composition from the Sn—Pb eutectic solder and has a melting temperature higher by about 40° C., it is becoming increasingly important to increase the cooling rate for providing a high quality soldering.

In the above-mentioned prior art (FIG. 10), the cooling rate is about 1 to 3°C./sec in case of only blowing air, in which air is blown entirely over the soldering face 2 of the circuit board 1 and therefore the cooling capacity is decentralized making it difficult to set the cooling rate to 50° C./sec or higher, which is not good enough to conduct an excellent soldering. In other words, the cooling fan 4 shown in FIG. 10 causes a turbulent air flow making it difficult to focus and target air onto a soldered joint surface for cooling. In addition, the cooling fan 4 cools also a portion to be soldered and a surface of solder in the solder bath which is located close to the soldered portion, as a result of which the quality of joint may be deteriorated.

Also, in a cooling method using a cooling apparatus shown in FIGS. 11A and 11B which is so designed as to absorb heat, the cooling effect is relatively small, and in case of a continuous operation the cool fin 5 cannot keep absorbing heat completely due to its limited radiation capacity and the cooling effect is further deteriorated.

Further, a cooling method shown in FIG. 12 provides a rapid cooling effect but may lead to such problems that a coolant 6 as a refrigerant accidentally gets into the solder bath which contains molten solder of a high temperature, and that mounted parts are rapidly cooled and destroyed due to a heat stress.

SUMMARY OF THE INVENTION

The present invention has been made under the above-mentioned circumstances, and therefore an object of the present invention is to provide a circuit board cooling apparatus which is capable of cooling a circuit board pin-pointing a soldered portion, thereby improving a cooling rate.

In order to achieve the above object, according to a first aspect of the present invention, there is provided a circuit board cooling apparatus including a cooling compartment having an open top and a bottom with a plurality of openings for taking in air, in which a circuit board to which electronic parts are soldered is conveyed over the open top of the cooling compartment, and a soldered portion on the circuit board is cooled by cooling air taken in through the openings of the cooling compartment, the cooling apparatus comprising:

at least one plane rectifier plate disposed above the openings of the cooling compartment in parallel with the circuit board which is conveyed over the open top of the cooling compartment, having a plurality of holes, and adapted to rectify the cooling air;

a plurality of inclined rectifier plates disposed on the plane rectifier plate in a plurality of lines in a direction of conveying the circuit board, inclined at a given angle in the conveying direction, and adapted to rectify the cooling air from the plane rectifier plate; and a plurality of air guide plates made of a heat-resistant flexible material, disposed toward distal ends of the inclined rectifier plates at intervals in the conveying direction, and allowing their distal ends to reach the circuit board.

According to a second aspect of the present invention, in the structure of the first aspect of the present invention, a length for which the air guide plate is in contact with a soldering face of the circuit board is set to be 3 cm or smaller but larger than 0 cm.

According to a third aspect of the present invention, in the structure of the first or second aspect of the present invention, the air guide plates are made of polyimide.

According to a fourth aspect of the present invention, in the structure of the first or second aspect of the present invention, the air guide plates are made of glass cloth impregnated with fluorine resin.

According to a fifth aspect of the present invention, in the structure of any one of the first to fourth aspects of the present invention, the air guide plates are coated with an antistatic material.

According to a sixth aspect of the present invention, in the structure of any one of the first to fifth aspects of the present invention, the air guide plates are detachably attached to the inclined rectifier plates.

According to a seventh aspect of the present invention, in the structure of any one of the first to sixth aspects of the present invention, the cooling compartment is sectioned into a plurality of zones by at least one partition, each of the plurality of zones has each of the openings through which the cooling air passes, and a valve is disposed on each of branch pipes of a blast pipe, which communicate with the respective openings.

According to an eighth aspect of the present invention, in the structure of any one of the first to seventh aspects of the present invention, an inclination angle of the inclined rectifier plates is set to 30 to 70°.

BRIEF DESCRIPTION OF THE DRAWINGS

These and other objects, features and advantages of this invention will become more fully apparent from the following detailed description taken with the accompanying drawings in which:

FIGS. 5A and 5B are diagrams showing an inclined rectifier plate and an air guide plate shown in FIG. 1, in which

FIGS. 6A and 6B are diagrams showing an inclined rectifier plate and an air guide plate in accordance with a second embodiment of the present invention, in which

FIGS. 7A and 7B are diagrams showing an inclined rectifier plate and an air guide plate in accordance with a third embodiment of the present invention, in which

FIGS. 11A and 11B are schematic views showing an example of a conventional circuit board cooling apparatus using a cooling fin, in which

DETAILED DESCRIPTION OF THE PREFERRED EMBODIMENTS

Now, a description will be given in more detail of preferred embodiments of the present invention with reference to the accompanying drawings.

A circuit board cooling apparatus 10 according to a first embodiment of the present invention will be described with reference to FIGS. 1 to 5B. The same parts as those in FIGS. 10 to 12 are designated by identical reference numerals and their description will be appropriately omitted.

Figure 1:
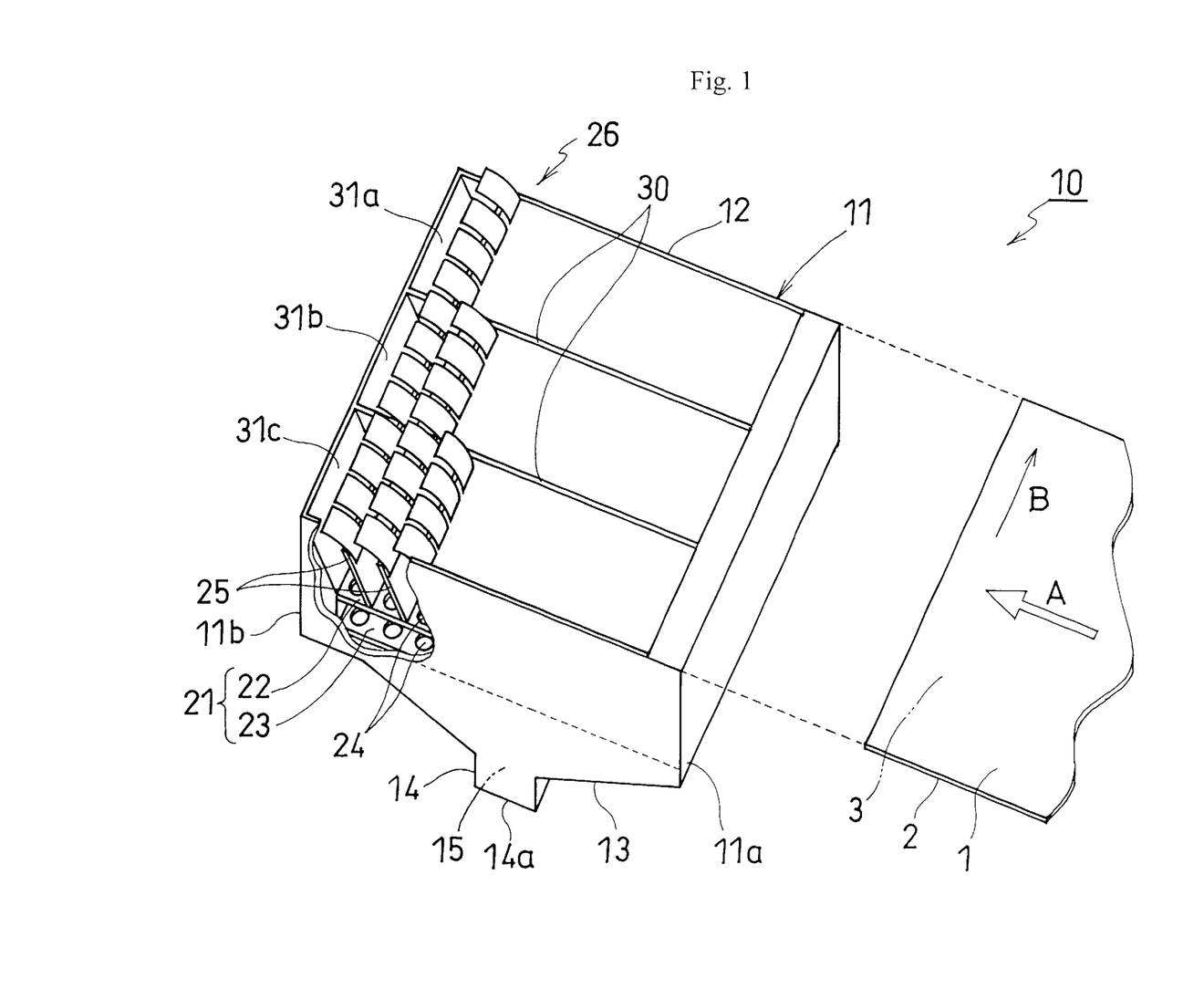
FIG. 1 is a perspective view schematically showing a circuit board cooling apparatus in accordance with a first aspect of the present invention.
Figure 2:
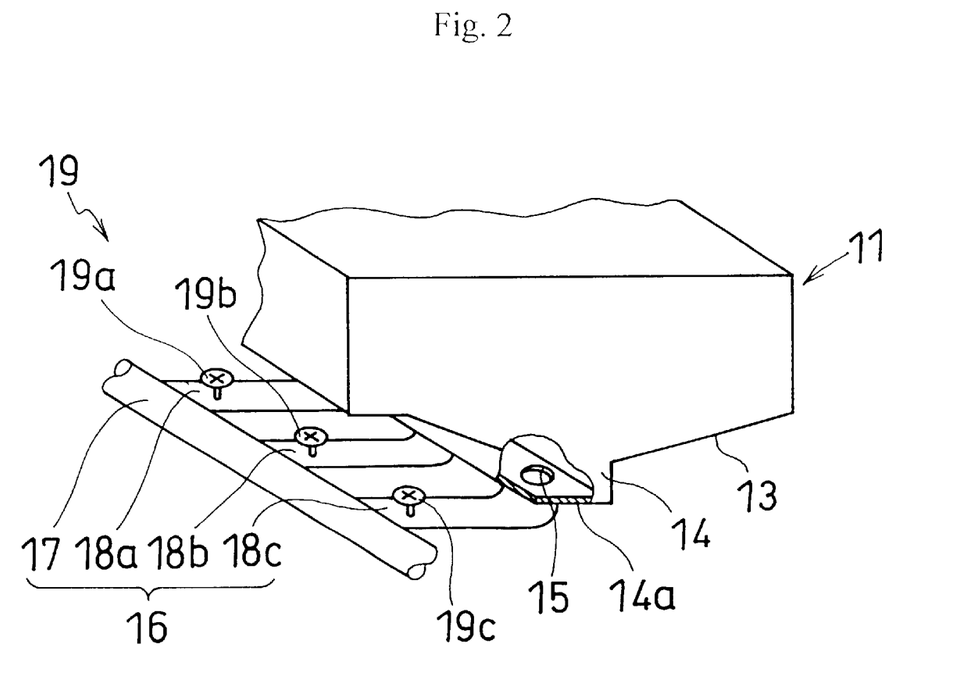
FIG. 2 is a perspective view showing a lower portion of the circuit board cooling apparatus shown in FIG. 1 which is partially cut.

The circuit board cooling apparatus 10 includes a cooling compartment 11 where a circuit board 1 is cooled as shown in FIGS. 1 and 2. The cooling compartment 11 is substantially rectangular in a plan view and has an open top (cooling compartment top) 12. A solder bath (not shown) is disposed close to the cooling compartment 11, and the circuit board 1 soldered at the solder bath is conveyed over the cooling compartment top 12. The cooling compartment 11 is designed in such a manner that a dimension in a direction A of conveying the circuit board 1 is about 250 mm and a dimension in a direction B orthogonal to the direction A is about 500 mm.

A bottom 13 of the cooling compartment 11 (cooling compartment bottom) is so structured as to be inclined downward from both sides 11a and 11b on the direction A side toward an approximate center with regard to the direction A. A cooling air intake portion 14 which is substantially box-shaped, projecting downward and extending along the direction B is formed at the approximate center of the cooling compartment bottom 13. A plurality of openings 15 (three in this embodiment) are formed at a bottom 14a of the cooling air intake portion 14 along a longitudinal direction thereof.

The openings 15 lead eventually to a blast pipe 16. The blast pipe 16 comprises a main pipe 17 that guides cooling air that has passed through a cooling device (not shown) and a plurality of branch pipes (three in this embodiment, and hereinafter those pipes are appropriately referred to as first, second and third branch pipes 18a, 18b and 18c in the order from the left in FIG. 2). Distal ends of the first, second and third branch pipes 18a, 18b and 18c are connected with the respective openings 15. The first, second and third branch pipes 18a, 18b and 18c are provided with first, second and third valves 19a, 19b and 19c (hereinafter generically referred to as "valves 19"), respectively, so as to control the supply of the cooling air to the openings 15.

Electronic parts 20 are disposed on one face (an upper side in FIG. 3) of the circuit board 1, and protruding portions (not shown) of the electronic parts pass through holes (not shown) formed in the circuit board 1 and project from an opposite face (a lower side in FIG. 3) so that the electronic parts 20 are soldered to the circuit board 1 on the opposite face of the circuit board 1. Hereinafter, the above opposite face of the circuit board 1 is called "soldering face 2", and a portion of the soldering face 2 which has been soldered as well as solder itself thereon is called "soldered portion 3". The circuit board 1 is conveyed over the cooling compartment top 12 in the direction A with the soldering face 2 directed toward the cooling compartment bottom 13.

Figure 3:
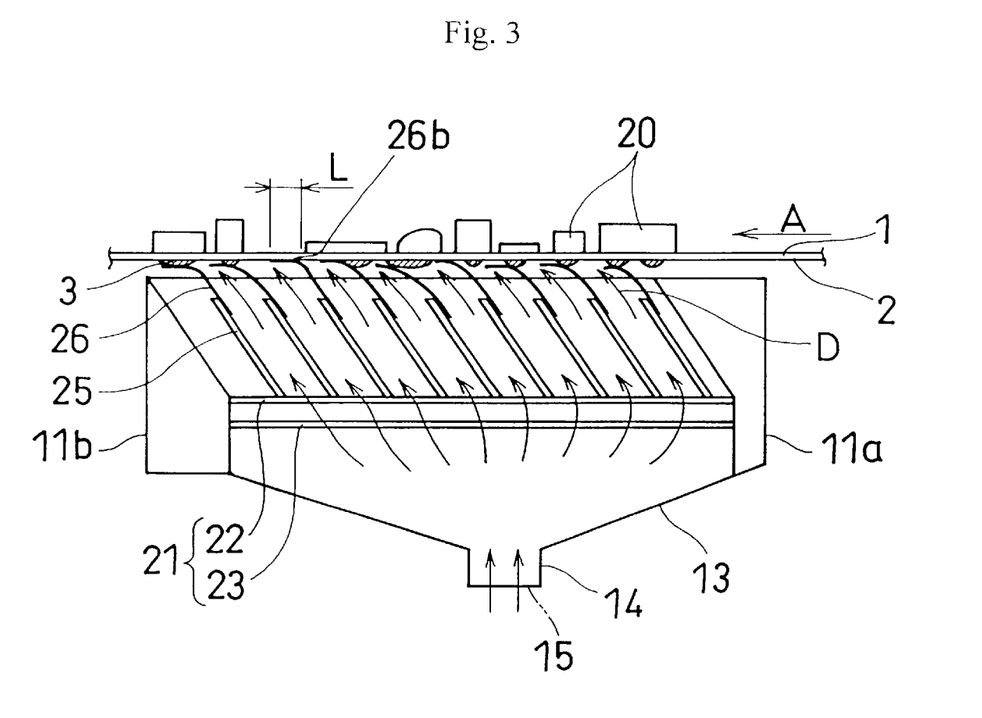
FIG. 3 is a diagram schematically showing flows of cooling air in the circuit board cooling apparatus shown in FIG. 1.
Figure 4:
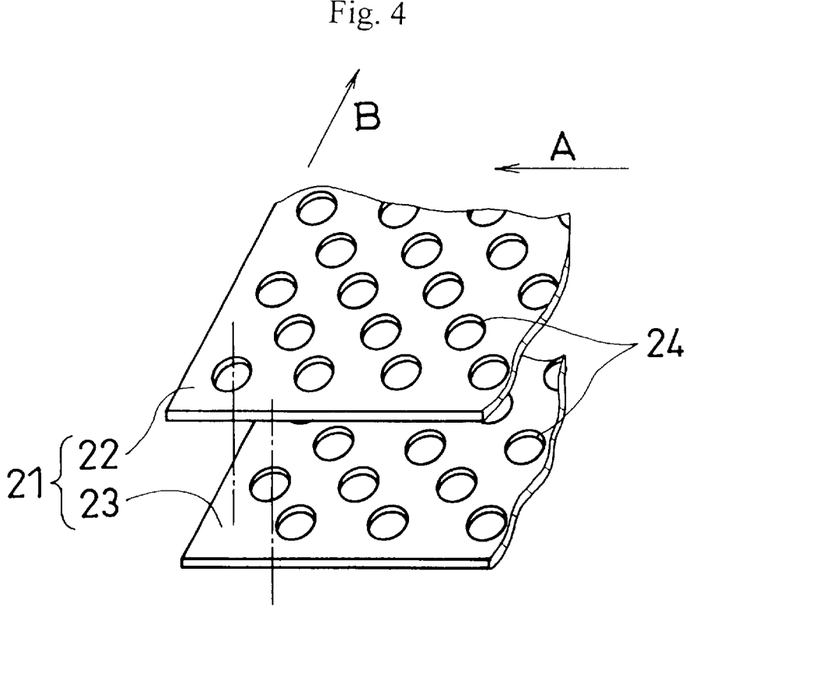
FIG. 4 is a perspective view showing upper and lower plane rectifier plates shown in FIG. 1.

As shown in FIGS. 1, 3 and 4, a plane rectifier plate 21 made of stainless steel or aluminum is disposed in parallel with the circuit board 1 conveyed over the cooling compartment top 12 and is positioned above the openings 15 inside the cooling compartment 11. The plane rectifier plate 21 comprises an upper plane rectifier plate 22 and a lower plane rectifier plate 23 which are disposed in parallel with each other with a given gap therebetween. A plurality of holes 24 are provided substantially in a matrix manner on the upper plane rectifier plate 22 and the lower plane rectifier plate 23, respectively, so as to pass the cooling air and to rectify its flows, then guide upward.

The plurality of holes 24 in the upper plane rectifier plate 22 are arranged so as to be shifted from one line to another and from one row to another. Also, the plurality of holes 24 in the lower plane rectifier plate 23 are arranged in the same manner. And, the plurality of holes 24 in the upper plane rectifier plate 22 and the plurality of holes 24 in the lower plane rectifier plate 23 are arranged so as to be shifted from each other vertically (not coincide with each other vertically). With the plurality of holes 24 of the upper and lower plane rectifier plates 22 and 23 arranged as described above, a pressure of the cooling air (air pressure) is uniformed, which allows the cooling air to be satisfactorily guided upward suppressing a turbulent or reverse flow.

As long as the air pressure can be uniformed, the arrangement of the holes 24 is not limited to the above-mentioned embodiment.

Also, instead of the plurality of holes 24 arranged substantially in a matrix manner, a plurality of slits (not shown) that extend in the direction A may be arranged in the direction B orthogonal to the direction A in the upper plane rectifier plate 22 or the lower plane rectifier plate 23, or a plurality of slits that extend in the direction B may be arranged in the direction A.

A plurality of inclined rectifier plates 25 made of stainless steel or aluminum with an inclination angle of about 45° are fitted onto the upper plane rectifier plate 22 in the direction A so as not to cover the holes 24. The inclined rectifier plates 25 are disposed in a plurality of lines (nine in this embodiment) in the direction A as shown in FIG. 3 and in a plurality of rows (three in this embodiment each having four air guide plates 26 (to be described later)) in the direction B as shown in FIG. 1. In FIG. 1, twelve air guide plates 26 at the first (forefront) line, eight at the second line and four at the third line are only shown for convenience, and remaining air guide plates 26 are omitted.

The provision of the inclined rectifier plates 25 allows the cooling air from the plane rectifier plate 21 to be rectified so as to be duly guided upward. In this case, since the inclined rectifier plate 25 has an inclination angle of about 45° with respect to the upper plane rectifier plate 22, the cooling air is surely rectified to flow toward the soldered portion 3.

The inclination angle of the inclined rectifier plate 25 is not limited to about 45O but may be set in a range of 30 to 70°. The reason that the inclination angle of the inclined rectifier plate 25 is set in a range of 30 to 70° is that the following characteristic deteriorations can be prevented which may occur when the inclination angle of the inclined rectifier plate 25 is set to under 30° or over 70°.

That is, in order for the air guide plate 26 formed of a heat-resistant film, having flexibility and attached to the inclined rectifier plates 25 to be set along the circuit board 1 which is conveyed in, it is necessary for the air guide plate 26 to receive the air pressure of the cooling air coming from its lower side. In this situation, if the inclination angle of the inclined rectifier plate 25 is set to less than 30°, a distal end 26b of the air guide plate 26 hangs down with its own weight and the effect of blowing the cooling air against circuit board 1 deteriorates. And, if the inclination angle of the inclined rectifier plate 25 is set to more than 70°, the air guide plate 26 is pushed too strongly against the circuit board 1 due to the air pressure, thereby disturbing flows of air coming from this side.

Figure 5A:
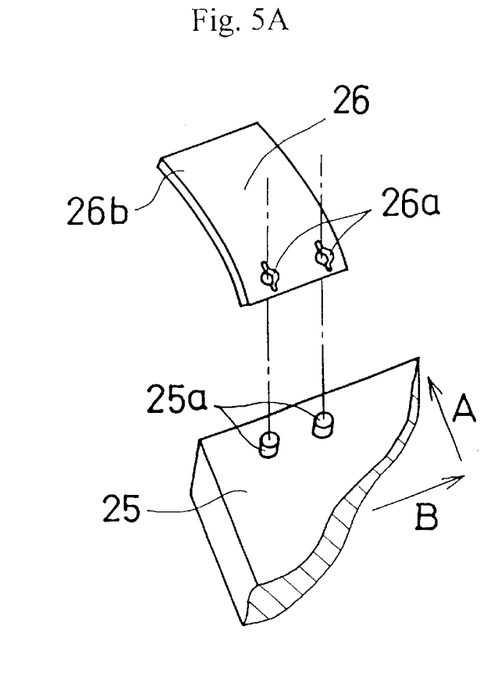
FIG. 5A is an exploded perspective view showing the inclined rectifier plate and the air guide plate and FIG. 5B is a perspective view showing how the air guide plate is attached to the inclined rectifier plate.

A plurality of protrusions 25a are formed toward a distal end of the inclined rectifier plate 25 at intervals in a longitudinal direction of the inclined rectifier plate 25 as shown in FIG. 5A. The air guide plates 26 each have two holes 26a, into which the protrusions 25a are inserted thereby holding the air guide plate 26 detachably to the inclined rectifier plate 25.

Figure 5B:
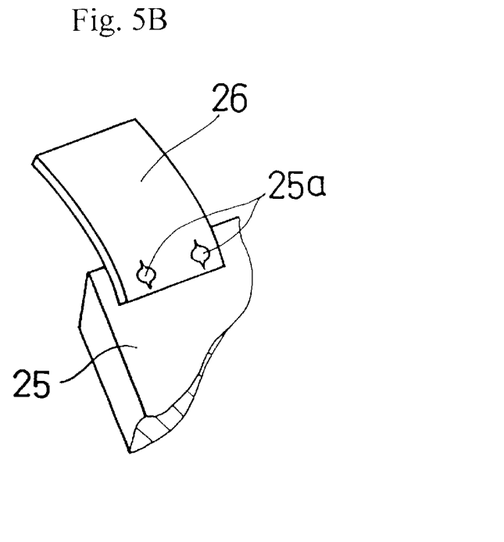

The air guide plate 26 is formed of a heat-resistant film of polyimide, has flexibility, and is shaped substantially rectangular as shown in FIGS. 5A and 5B measuring about 100 mm in length and 20 to 30 mm in width with a thickness of 0.1 to 0.2 mm. The air guide plate 26 has the holes 26a toward its proximal end, which are slightly smaller in diameter than the protrusions 25a. The protrusions 25a are inserted into the holes 26a to thereby hold the air guide plates 26 detachably to the inclined rectifier plate 25.

The distal end 26b of the air guide plate 26 is adapted to contact for a given length L with the soldering face 2 of the circuit board 1 which has been conveyed over the cooling compartment 11. In this case, the length L is set to be 3 cm or smaller but larger than 0 cm.

Partitions 30 are disposed inside the cooling compartment 11 in parallel with the direction A, whereby the cooling compartment 11 is sectioned into a plurality of zones (three in this embodiment, first, second and third zones 31a, 31b and 31c from the upper side in FIG. 1 to the lower side). Selection of zones to be used is made from the first, second and third zones 31a, 31b and 31c according to the size of the circuit board 1, and the valves 19 for the selected zones only are opened, thereby narrowing the usage of the zones down to minimum necessity for efficiently cooling the circuit board 1.

Specifically, for the circuit board 1 which can be covered by the first zone 31a, only the first valve 19a is opened. In this case, air does not go into the second and third zones 31b and 31c, which improves cooling efficiency.

In the circuit board cooling apparatus 10 structured as above, the circuit board 1 which has been soldered at the solder bath (not shown) disposed close to the cooling compartment 11 is conveyed in the direction A over the cooling compartment top 12.

In this situation, the cooling air pushes with its pressure the distal end 26b of the air guide plate 26 against the soldering face 2 (soldered portion 3) of the circuit board 1. In this case, the length L for which the air guide plate 26 is in contact with the circuit board 1 is set to be 3 cm or smaller but larger than 0 cm as described above, so that the cooling air also flows through between the soldering face 2 and the air guide plate 26 as indicated by an arrow D in FIG. 3 and is converged on the soldered portion 3. As a result, the soldered portion 3 is pinpointedly cooled and the cooling rate is improved, thereby improving the cooling capability.

Also, since the cooling air is accurately targeted at the soldered portion 3, the surface of solder contained in the solder bath can be prevented from getting undesirably cooled. In addition, since undesirable cooling of the solder in the solder bath can be prevented, the cooling compartment 11 can be located close to the solder bath, as a result of which the entire apparatus including the cooling compartment 11 and the solder bath can be downsized.

Further, the air guide plate 26, which has heat resistance, is hard to wear even if it is in direct contact with the soldered portion 3 with a high temperature. As a result, the intake of the cooling air and the maintenance of the excellent cooling rate can be stably performed over a long period of time.

The experiments by a sample apparatus fabricated on the basis of the above-mentioned embodiment confirmed that a cooling rate of 50° C./sec can be obtained, and that the provision of the air guide plate 26 improves the cooling rate.

Since the cooling rate of 50° C./sec can be obtained as described above, high quality soldering strength can be ensured. Also, because the cooling rate of 50° C./sec or higher is obtained and the high quality soldering strength is ensured as described even in the circuit board 1 in which Pb-free solder is used for soldering the electronic parts 20, the use of the Pb-free solder is promoted replacing Sn—Pb eutectic solder which has been conventionally employed, thereby enhancing environmental protection.

Since the air guide plate 26 is detachably attached to the inclined rectifier plate 25, it can be readily replaced by a new one when required to do so, which reduces a loss of time during a production process and improves the productivity.

Also, since the length L for which the air guide plate 26 is in contact with the circuit board 1 is set to be 3 cm or smaller but larger than 0 cm, the air guide plate 26 is adapted to be in close contact with the soldered portions 3 of various configurations, thereby efficiently applying the cooling air to the soldered portions 3, which improves the cooling capability.

In addition, since the air guide plate 26 has flexibility, the air guide plate 26 is adapted to be in close contact with the soldered portions 3 of various configurations, thereby efficiently applying the cooling air onto the soldered portions 3, which improves the cooling capability.

The air guide plate 26 is made of a heat-resistant film of polyimide, but may be of glass cloth impregnated with fluorine resin instead.

Also, when the electronic parts 20 apt to be easily affected or damaged by static electrification are mounted on the circuit board 1, the air guide plate 26 can be coated with an antistatic material (not shown) to prevent the static electrification. If the air guide plate 26 is coated with an antistatic material, the apparatus can be used for the circuit board 1 which is provided with the electronic parts 20 unsuitable for the static electrification, and its versatility can be expanded as much.

When the air guide plate 26 is made of polyimide, the antistatic material is to be made of polypyrrole, and when the air guide plate 26 is made of glass cloth impregnated with fluorine resin, the antistatic material is to be made of carbon, whereby the static electrification can be appropriately prevented.

The above embodiment employs two plane rectifier plates 21, i.e., upper and lower plane rectifier plates 22 and 23. However, the present invention is not limited to this structure but may employ one plane rectifier plate or three or more plane rectifier plates.

Figure 6A:
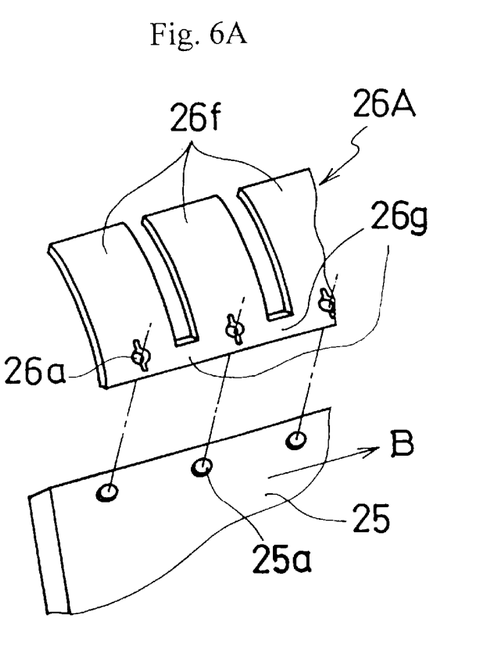
FIG. 6A is an exploded perspective view showing the air guide plate and the inclined rectifier plate and FIG. 6B is a perspective view showing how the air guide plate is attached to the inclined rectifier plate.
Figure 6B:
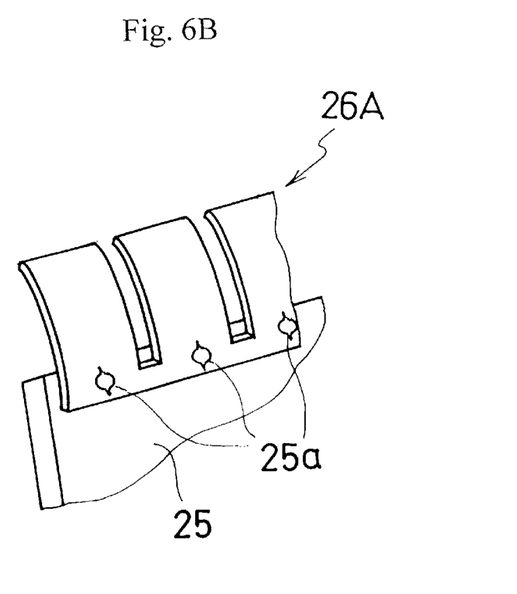

Instead of the air guide plate 26 according to the above first embodiment, a multiple air guide plate 26A may be used as shown in FIGS. 6A and 6B (second embodiment). The multiple air guide plate 26A comprises a plurality of air guide plates proper 26f each corresponding to the air guide plate 26 of the first embodiment and a plurality of plate connecting portions 26g that connect the plurality of air guide plates proper 26f at proximal ends. One hole 26a is formed toward the proximal end of the respective air guide plates proper 26f. Also, a plurality of protrusions 25a are formed on the respective inclined rectifier plates 25 and positioned corresponding to a plurality of holes 26a of the multiple air guide plate 26A, and the protrusions 25a are inserted into the holes 26a so as to retain the multiple air guide plate 26A as shown in FIG. 6B.

According to the second embodiment, since one multiple air guide plate 26A has a plurality of air guide plates proper 26f (corresponding to the air guide plate 26 in this first embodiment), the plurality of air guide plates proper 26f gathered as one multiple air guide plate 26A can be attached to the inclined rectifier plate 25. Thus, the attachment is rapidly and readily conducted as compared with the first embodiment in which the plurality of air guide plates 26 are attached individually, and thereby the productivity can be improved.

Figure 7A:
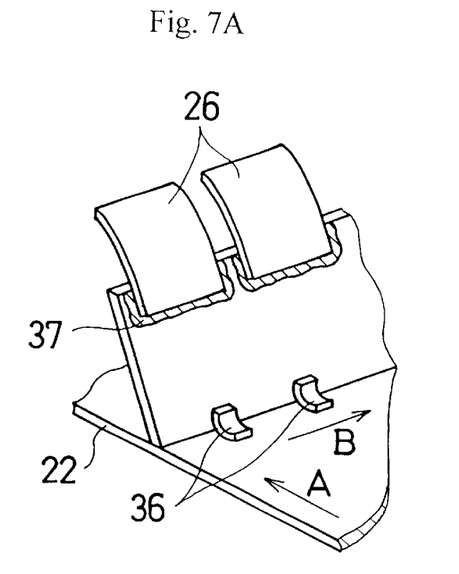
FIG. 7A is an exploded perspective view showing how the air guide plate is attached to the inclined rectifier plate and FIG. 7B is a side view showing how the air guide plate is attached to the inclined rectifier plate.
Figure 7B:
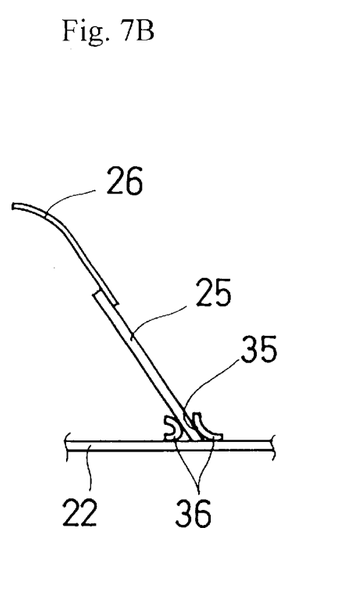

Also, instead of the above embodiments, a plurality of pairs of pressure bar springs 36 each pair aligned in the direction A and having a gap 35 are disposed on the upper plane rectifier plate 22 in the direction B orthogonal to the direction A and welded thereto, as shown in FIGS. 7A and 7B. Then, the inclined rectifier plate 25 is detachably attached to the upper plane rectifier plate 22 by means of the pressure bar springs 36 and the air guide plate 26 is fixed to the inclined rectifier plate 25 with an adhesive 37 (third embodiment).

According to the third embodiment, when the air guide plate 26 is replaced by a new one, the inclined rectifier plate 25 can be detached from the plane rectifier plate 21 by releasing the pressure of the pressure bar springs 36. Thus, the replacement of the air guide plate 26 can be readily conducted, whereby the loss of time in the production process can be shortened and the productivity can be improved.

Figure 8:
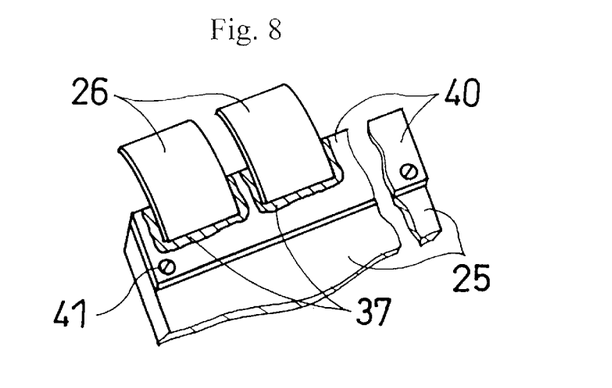
FIG. 8 is a perspective view showing how an air guide plate is attached to an inclined rectifier plate in accordance with a fourth embodiment of the present invention.

Also, instead of the above-mentioned third embodiment, the air guide plate 26 may be fixed with an adhesive 37 to a support plate 40 which is about 0.5 mm in thickness, and the support plate 40 may be detachably attached to the inclined rectifier plate 25 by screws 41 (fourth embodiment), as shown in FIG. 8.

According to the fourth embodiment, since the air guide plate 26 can be detached from the inclined rectifier plate 25 together with the support plate 40 by unscrewing the screws 41, the replacement of the air guide plate 26 can be relatively readily conducted, whereby the loss of time in the production process can be shortened and the productivity can be improved as in the second embodiment.

Figure 9:
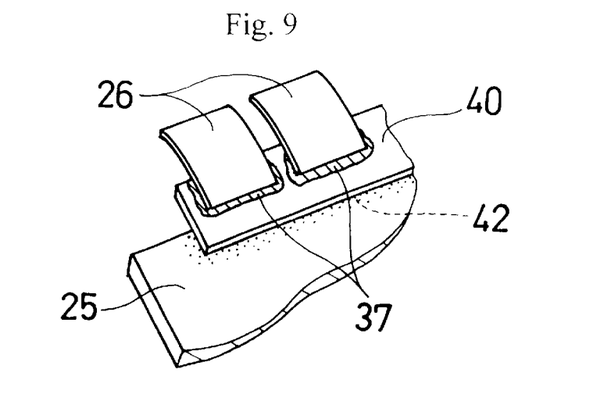
FIG. 9 is a perspective view showing how an air guide plate is attached to an inclined rectifier plate in accordance with a fifth embodiment of the present invention.

Further, instead of the above-mentioned fourth embodiment, the support plate 40 may be detachably attached to the inclined rectifier plate 25 with an adhesive 42 (fifth embodiment) as shown in FIG. 9.

According to the fifth embodiment, since the adhesive 42 breaks up on the inclined rectifier plate 25 by pulling the support plate 40 to detach the air guide plate 26 from the inclined rectifier plate 25 together with the support plate 40, the replacement of the air guide plate 26 can be readily conducted, whereby the loss of time in the production process can be shortened and the productivity can be improved as in the fourth embodiment.

As described above, according to any one of the first to sixth aspects of the present invention, the cooling air from the openings of the cooling compartment is rectified and guided upward by means of the plane rectifier plates and the inclined rectifier plates, and also flows through between the soldering face of the circuit board and the air guide plate so as to be converged on the soldered portion on the circuit board. As a result, the soldered portion is pinpointedly cooled and the cooling rate is improved, thereby improving the cooling capability.

Also, since the soldered portion is pinpointedly cooled, such a drawback that the surface of solder in the solder bath disposed close to the cooling compartment is undesirably cooled can be prevented. In addition, since undesirable cooling of the solder in the solder bath can be prevented, the cooling compartment can be located close to the solder bath, as a result of which the entire apparatus including the cooling compartment and the solder bath can be downsized.

Further, because the cooling rate of 50° C./sec or higher is obtained and the high quality soldering strength is ensured even in the circuit board in which Pb-free solder is used for soldering the electronic parts, the use of the Pb-free solder is promoted replacing the Sn—Pb eutectic solder which has been conventionally employed, thereby enhancing the environmental protection.

Still further, the air guide plate, which has heat resistance, is hard to wear even if it is in direct contact with the soldered portion with a high temperature. As a result, the intake of the cooling air and the maintenance of the excellent cooling rate can be stably performed over a long period of time.

Yet still further, since the air guide plate has flexibility, the air guide plate is adapted to be in close contact with the soldered portions of various configurations, thereby efficiently applying the cooling air to the soldered portions, which improves the cooling capability.

According to the second aspect of the present invention, since the length of the air guide plate in contact with the circuit board is set to be 3 cm or smaller but larger than 0 cm, the air guide plate is adapted to be in close contact with the soldered portions of various configurations, thereby efficiently applying the cooling air to the soldered portions, which improves the cooling capability.

According to the fifth aspect of the present invention, since antistatic effect is obtained by the antistatic material coated on the air guide plate, the apparatus can be used for the circuit board provided with the electronic parts apt to be easily affected or damaged by static electrification, and its versatility can be expanded as much.

According to the sixth aspect of the present invention, since the air guide plate is detachably attached to the inclined rectifier plate, the air guide plate can be readily replaced by a new one, thereby reducing a loss of time during a production process and improving the productivity.

According to the seventh aspect of the present invention, since the cooling compartment is sectioned into a plurality of zones by at least one partition and since valves corresponding to the respective zones can be opened independently so that the cooling air can be taken in only for the zones required to cover the size of the circuit board, the cooling capability can be improved as much.

According to the eighth aspect of the present invention, since the inclination angle of the inclined rectifier plate is 30 to 70°, the cooling air is surely rectified to flow toward the circuit board, and the circuit board is efficiently cooled.

The foregoing description of the preferred embodiments of the invention has been presented for the purpose of illustration and description. It is not intended to be exhaustive or to limit the invention to the precise form disclosed, and modifications and variations are possible in light of the above teachings or may be acquired from practice of the invention. The embodiments were chosen and described in order to explain the principle of the invention and its practical application to enable one skilled in the art to utilize the invention in various embodiments and with various modifications as are suited to the particular use contemplated. It is intended that the scope of the invention be defined by the claims appended hereto and their equivalents.

What is claimed is:

1. A circuit board cooling apparatus for use with a solder bath disposed close to the apparatus and a circuit board to which electronic parts are soldered, comprising:

a cooling compartment having an open top and a bottom with a plurality of openings for taking in cooling air, the cooling compartment defining one end that is close to the solder bath and an opposite end that is opposite to the one end, the circuit board to which the electronic parts are soldered being transported in a transporting direction over the open top of the cooling compartment from the one end of the cooling compartment toward the opposite end of the cooling compartment, soldered portions on the circuit board being cooled by the cooling air taken in through the openings of the cooling compartment and flowing from the bottom of the cooling compartment toward the open top of the cooling compartment with inclination towards the transporting direction of the circuit board;

at least one plane rectifier plate disposed above the openings of the cooling compartment in parallel with the circuit board, the at least one plane rectifier plate having a plurality of holes, and adapted to rectify the cooling air;

a plurality of inclined rectifier plates defining distal ends and being disposed on the at least one plane rectifier plate in a plurality of lines in the transporting direction of the circuit board, the plurality of inclined rectifier plates being inclined at a given angle in the transporting direction, and adapted to rectify the cooling air from the plane rectifier plate; and a plurality of air guide plates defining distal ends and being made of a heat-resistant flexible material, the plurality of air guide plates being disposed on the distal ends of the inclined rectifier plates at intervals in the transporting direction, and allowing the distal ends of the plurality of air guide plates to reach the circuit board.

2. A circuit board cooling apparatus according to claim 1, wherein a length for which the air guide plate is in contact with a soldering face of the circuit board is set to be 3 cm or smaller but larger than 0 cm.

3. A circuit board cooling apparatus according to claim 1, wherein the air guide plates are made of polyimide.

4. A circuit board cooling apparatus according to claim 1, wherein the air guide plates are made of glass cloth impregnated with fluorine resin.

5. A circuit board cooling apparatus according to claim 1, wherein the air guide plates are coated with an antistatic material.

6. A circuit board cooling apparatus according to claim 1, wherein the air guide plates are detachably attached to the inclined rectifier plates.

7. A circuit board cooling apparatus according to claim 1, wherein the cooling compartment is sectioned into a plurality of zones by at least one partition, each of the plurality of zones has each of the openings through which the cooling air passes, and a valve is disposed on each of branch pipes of a blast pipe, which communicate with the respective openings.

8. A circuit board cooling apparatus according to claim 1, wherein an inclination angle of the inclined rectifier plates is set to 30 to 70°.

9. An apparatus for cooling a circuit board having soldered portions and carried over a top portion of the apparatus in a direction of circuit board movement, comprising:

a cooling compartment having an open top and a bottom which defines a plurality of openings;

at least one plane rectifier plate having hole perforations and disposed in the cooling compartment parallel to the circuit board to be cooled to allow cooling air to flow from the bottom to the top through the hole perforations;

a plurality of inclined rectifier plates disposed in a plurality of lines on top surface of a top plane rectifier plate of the at least one plane rectifier plate, the inclined rectifier plates being inclined toward the direction of circuit board movement; and a plurality of air guide plates made of a flexible material and attached to a distal end of the inclined rectifier plates to extend toward the circuit board.

* * * * *